United States Patent [19]

Chittipeddi et al.

[11] Patent Number: 5,268,329
[45] Date of Patent: Dec. 7, 1993

[54] METHOD OF FABRICATING AN INTEGRATED CIRCUIT INTERCONNECTION

[75] Inventors: Sailesh Chittipeddi, Whitehall; Michael J. Kelly, Orefield, both of Pa.

[73] Assignee: AT&T Bell Laboratories, Murray Hill, N.J.

[21] Appl. No.: 789,784

[22] Filed: Nov. 8, 1991

Related U.S. Application Data

[63] Continuation of Ser. No. 531,802, May 31, 1990, abandoned.

[51] Int. Cl.$^5$ .................................. H01L 21/44
[52] U.S. Cl. ...................... 437/195; 437/190; 437/197; 437/200
[58] Field of Search ............. 437/201, 200, 195; 357/71

[56] References Cited

U.S. PATENT DOCUMENTS

| | | | |
|---|---|---|---|
| 3,657,029 | 4/1972 | Fuller | 437/228 |
| 4,619,839 | 10/1986 | Lehrer | 437/235 |
| 4,755,480 | 7/1988 | Yau et al. | 437/193 |
| 4,784,973 | 11/1988 | Stevens et al. | 437/200 |
| 4,800,177 | 1/1989 | Nakamae | 437/200 |
| 4,812,419 | 3/1989 | Lee et al. | 437/200 |
| 4,816,424 | 3/1989 | Watanabe et al. | 437/192 |
| 4,818,661 | 4/1989 | Taylor et al. | 204/15 |
| 4,829,024 | 5/1989 | Klein et al. | 437/192 |
| 4,884,123 | 11/1989 | Dixit et al. | 437/190 |
| 4,897,709 | 1/1990 | Yokoyama et al. | 437/197 |
| 4,910,169 | 3/1990 | Hoshino | 437/189 |
| 4,910,578 | 3/1990 | Okamoto et al. | 357/71 |
| 4,952,524 | 8/1990 | Lee et al. | 437/982 |
| 4,962,414 | 10/1990 | Liou et al. | 437/189 |
| 4,981,550 | 1/1991 | Huttemann et al. | 437/194 |
| 4,987,562 | 1/1991 | Watanabe | 357/71 |

FOREIGN PATENT DOCUMENTS

| | | | |
|---|---|---|---|
| 0343269 | 11/1989 | European Pat. Off. | 437/195 |
| 0353120 | 1/1990 | European Pat. Off. | |
| 0354717 | 2/1990 | European Pat. Off. | |
| 3414781 | 10/1984 | Fed. Rep. of Germany | 437/197 |
| 0292653 | 11/1988 | Japan | 437/195 |
| 0005035 | 1/1989 | Japan | 437/197 |
| 0211948 | 8/1989 | Japan | 437/195 |
| 0035753 | 2/1990 | Japan | 437/197 |
| 1596907 | 9/1981 | United Kingdom | |

OTHER PUBLICATIONS

Wolf et al.; vol. 1; 1986; pp. 388-393; Silicon Processing for the VLSI Era.
J. Vac. Sci. Technol. A2(2), Apr.-Jun. 1984, "Barrier layers: Principles and applications in microelectronics," Marc Wittmer, pp. 273-280.
J. Appl. Phys. 54(2), Feb. 1983, "Investigation of the Al/TiSi$_2$/Si contact system," C. Y. Ting & M. Wittmer, pp. 937-943.
J. Vac. Sci. Technol., 21(1), May/Jun. 1982, "TiN formed by evaporation as a diffusion barrier between Al and Si," C. Y. Ting, pp. 14-18.
Semiconductor International, Oct. 1989, "Materials for Contacts, Barriers and Interconnects," S. Gupta et al., pp. 80-86.
IEEE/IRPS, 1987, "Stress Related Failures Causing Open Metallization," S. K. Groothuis et al., pp. 1-8.
IEEE/IRPS, 1987, "The Effect of CuAddition to Al-Si Interconnects on Stress Induced Open-Circuit Failures", S. Mayumi et al., pp. 15-21.
High aspect ratio hole filling by tungsten CVD combined with a Si side wall and barrier metal for multilevel interconnection; Suguro et al.; Apr. 1987, J. Appl. Phys. 62(4), pp. 1265-1273.

Primary Examiner—Brian E. Hearn
Assistant Examiner—Michael Trinh
Attorney, Agent, or Firm—John T. Rehberg

[57] ABSTRACT

A conductive layer is formed beneath a runner in an integrated circuit. The conductive layer is also formed within vias. The conductive layer preserves electrical connection should the runner separate due, perhaps, to electromigration or stress voiding. The conductive layer also provides protection against various failures or defects which may occur in the runner material within the vias.

2 Claims, 1 Drawing Sheet

METHOD OF FABRICATING AN INTEGRATED CIRCUIT INTERCONNECTION

This application is a continuation of application Ser. No. 07/531,802, filed on May 31, 1990, now abandoned.

TECHNICAL FIELD

This invention relates to integrated circuits and methods for manufacturing them; more particularly, it relates to conductive interconnections between individual devices on integrated circuits and methods for fabricating such interconnections.

BACKGROUND OF THE INVENTION

Conventional integrated circuit manufacturing processes typically involve the creation of openings (often termed "vias" or "windows") in a dielectric layer. The openings are often subsequently filled with a conductive material, such as a metal or polysilicon, which provides electrical connection through the dielectric. For example, in many MOSFET fabrication processes, after the source, gate and drain have been formed, a dielectric is deposited in a blanket manner over the transistor. An opening is created above some or all of the sources and drains. A conductive material, for example, aluminum or tungsten is deposited within the opening, thus contacting the source or drain. The conductive material in the opening provides a path for electrical contact between the source or drain and a conductive (often metallic) runner on the upper surface of the dielectric.

In multilevel integrated circuits, additional layers of dielectric are deposited with openings formed therein. Conductive material is formed within these openings. The conductive material serves to provide the electrical contact between runners beneath the additional dielectric layer and runners above the additional dielectric layer.

As the dimensions of integrated circuits continue to shrink, the linewidths of the conductors also continue to decrease, i.e., the conductors become narrower. However, stresses imposed upon the conductive runners also increase, thus causing stress-related electromigration failures (or other types of failures) in narrow runners which may lead to undesirable open circuits.

SUMMARY OF THE INVENTION

A method of fabricating an integrated circuit, in accordance with an illustrative embodiment of the invention, includes: forming of a dielectric layer covering a raised conductor; forming an opening in the dielectric layer, the opening exposing the conductor; forming a first conductive material layer upon the dielectric and within the opening and contacting the raised conductor; forming a second conductive material layer upon the first material layer; patterning the second and first material layers to form runners.

DETAILED DESCRIPTION

The hazards of conductor failure are alleviated by the present invention in which runners are formed from at least two layers of conductive material. One of the layers (typically the lower layer), being less susceptible to separation, preserves conduction should the other layer fail.

Figure 1:
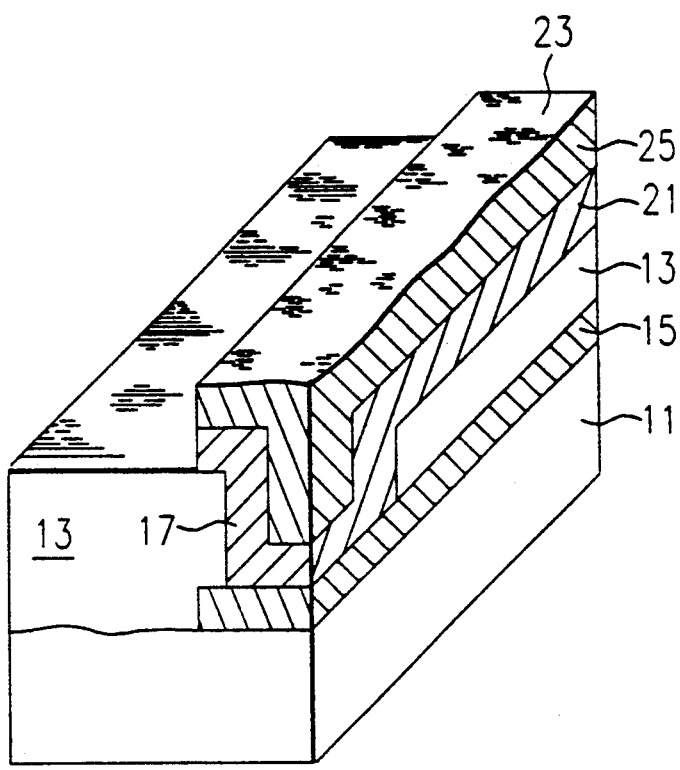
FIGS. 1 and 2 are partially cross-sectional, partially perspective views showing an illustrative embodiment of the present invention.

In FIG. 1, reference numeral 11 designates a dielectric body in a typical integrated circuit which may be silicon dioxide, silicon nitride, etc. The exact composition of body 11 is not critical. Overlying body 11 is a raised conductive runner 15. Runner 15 may be made from aluminum, aluminum containing small amounts of copper and/or silicon, other aluminum-rich mixtures or alloys, tungsten, a copper-rich material, polysilicon, or silicide. Typically, reference numeral 15 designates a portion of a conductive interconnection between circuit elements.

Runner 15 is supported by dielectric 13 which may be silicon dioxide. For example, reference numeral 13 may denote silicon dioxide produced by a silane-based reaction or a reaction based upon some other precursor material. Some examples of suitable precursors are tetraethoxysilane ($Si(OC_2H_5)_4$) with the acronym "TEOS," tetramethoxysilane ($Si(OCH)_4$) with the acronym "TMOS," diacetoxyditertiarybutoxysilane ($C_{10}H_{26}O_4Si$) with the acronym "DADBS," and tetramethylcyclotetrasiloxane ($C_4H_{16}Si_4O_4$) with the acronym "TMCTS" sold under the trade name "TOMCATS" by J. C. Schumacher, a unit of Air Products and Chemicals, Inc. Alternatively, dielectric 13 may be formed by plasma enhanced chemical vapor deposition using any of the above precursors if desired. Furthermore, dielectric 13 may be a multilayered dielectric having, for example, a layer formed from TEOS underlying a layer formed from TEOS together with boron and/or phosphorous dopants ("BPTEOS").

Opening 17 is formed in dielectric 13. Methods for forming openings such as opening 17 in dielectric layers are well known to those skilled in the art. Conventional processes frequently involve the deposition of a photoresist, selective exposure of the photoresist to radiation, washing away the exposed (or unexposed) portions of the photoresist, and then using the remaining adhering photoresist material as an etching mask. Other methods may be used.

Next, a conductive runner is formed by depositing at least two (and perhaps three or more) conductive materials and patterning them either together or sequentially. For example, referring to FIG. 1, layer 21 may be a conducting nitride or a refractory metal silicide. Alternatively, layer 21 may be a bilayer of a conducting nitride overlying a silicide or vice versa. Examples of suitable nitrides are: titanium nitride and zirconium nitride. Examples of suitable silicides are titanium silicide and tungsten silicide. Another suitable material is titanium tungsten. Layer 21 provides a lining within opening 17, but layer 21 does not completely fill it. Since layer 21 is conductive, it forms electrical contact with conductive runner 15. Fabrication details for layer 21 will be provided below.

Overlying layer 21 is conductive layer 23 which may be aluminum or aluminum with small amounts of either copper or silicon or both, or an aluminum-rich alloy or mixture, or a metal comprising primarily copper, or a metal comprising primarily tungsten. After material layers 21 and 23 are formed, they are patterned either together or separately to form the runner configuration illustrated in FIG. 1.

If layer 21 is titanium nitride, it may be formed by a variety of techniques known to those skilled in the art including: inert sputter deposition from a composite target or reactive sputter deposition from a titanium target in a nitrogen atmosphere or evaporation of a titanium nitride thin film. Analogous methods known to those skilled in the art may be used to form other conducting nitrides.

If layer 21 is a refractory silicide it may be formed by inert sputter deposition from refractory silicide targets. Other methods of silicide formation may also be practiced by those skilled in the art.

If layer 21 is a bilayer, for example, of a nitride and a silicide, it may be formed by sequential application of the forming steps above.

If the size of opening 17 is about one micron, the thickness of layer 21 may be between about 150 and 1,000 Å and the thickness of conductive runner 23 may be between about 4,000 and 10,000 Å.

Some of the advantages of the inventive configuration are described below. If layer 23 is made from aluminum with a small amount of silicon (a common practice when fabricating contacts to source and drain regions), the silicon may tend to precipitate at the lower portion 25 of layer 23 within opening 17. Under ordinary circumstances, silicon precipitation at the bottom of a via opening impairs conduction between runners above and below the opening. However, in the present invention, the presence of layer 21 provides sufficient conduction along the sides of opening 17 to prevent an open circuit.

Figure 2:
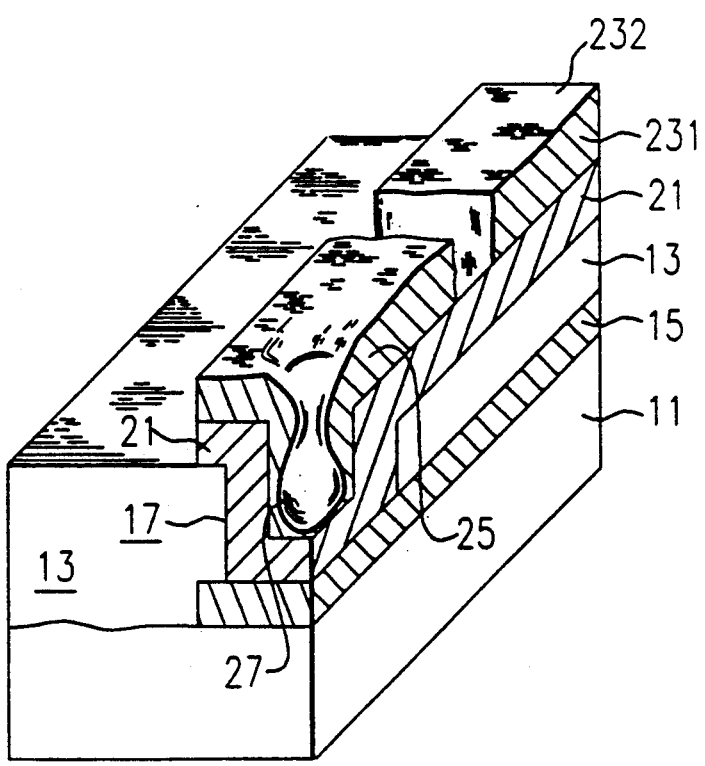

Turning to FIG. 2, some additional advantages of the present invention are presented. Should runner 23 (in FIG. 1) separate into two portions 232 and 231 (illustrated in FIG. 2) due to electromigration, stress voiding, or other causes, underlying layer 21 will tend to preserve electrical conduction. Experience has shown that if runner 23 is an aluminum-silicon-copper material (approximately 0.5% copper, 0.75% silicon), and if layer 21 is approximately 150 Å TiN/600 Å TiSi$_2$, and if runner 23 separates due to electromigration or other forces, layer 21 remains intact, preserving conduction.

Furthermore, if layer 23 is aluminum, it may not adequately fill opening 17. As illustrated in FIG. 2, an opening or void 27 may be formed during conventional aluminum deposition processes. However, layer 21 again provides adequate electrical conduction, thus preventing an undesired open circuit.

Both titanium nitride and titanium silicide have been employed by integrated circuits designers as a barrier material between a source/drain region and an overlying aluminum material in a via or window. However, the purpose for the titanium nitride or titanium silicide is to prevent spiking (i.e., movement of the underlying silicon upwards into the aluminum). The use of these materials within an opening such as a via connecting raised conductive runners is unexpected. The disclosed structure does not significantly increase overall runner system resistance, although it significantly enhances runner system reliability and reliability of contact structures.

We claim:

1. A method of semiconductor integrated circuit fabrication comprising:
    forming a dielectric covering a raised first aluminum-rich conductor;
    forming an opening in said dielectric, said opening exposing a portion of said first conductor;
    forming a layer of refractory metal silicide upon said dielectric and within said opening and contacting said raised first conductor;
    forming a layer of titanium nitride upon said layer of refractory metal silicide by reactive sputter deposition from a refractory metal target in a nitrogen atmosphere;
    forming a second aluminum-rich conductive material layer contacting said titanium nitride layer within said opening and contacting said titanium nitride layer upon said dielectric;
    patterning said second conductive layer and said titanium nitride layer and said refractory metal silicide layer to form a runner.

2. A method of semiconductor integrated circuit fabrication comprising:
    forming a dielectric layer covering a raised first aluminum-rich conductor;
    forming an opening in said dielectric layer, said opening exposing a portion of said first conductor;
    forming a layer of titanium nitride upon said dielectric and within said opening and contacting said first conductor;
    forming a refractory metal silicide material layer upon said layer of titanium nitride, said silicide being formed by inert sputter deposition from a refractory silicide target;
    forming a second aluminum-rich conductive material layer contacting said refractory metal silicide layer within said opening and contacting said refractory metal silicide layer upon said dielectric;
    patterning said second conductive material layer and said refractory metal silicide layer and said titanium nitride layer to form a runner.

* * * * *